US010803956B2

(12) United States Patent
Kim et al.

(10) Patent No.: US 10,803,956 B2
(45) Date of Patent: Oct. 13, 2020

(54) MEMORY DEVICE, MEMORY SYSTEM HAVING MEMORY DEVICE, AND METHOD OF OPERATING MEMORY DEVICE

(71) Applicant: SK hynix Inc., Gyeonggi-do (KR)

(72) Inventors: Jong Wook Kim, Chungcheongbuk-do (KR); Se Chang Park, Chungcheongbuk-do (KR)

(73) Assignee: SK hynix Inc., Gyeonggi-do (KR)

(*) Notice: Subject to any disclaimer, the term of this patent is extended or adjusted under 35 U.S.C. 154(b) by 43 days.

(21) Appl. No.: 16/231,892

(22) Filed: Dec. 24, 2018

(65) Prior Publication Data
US 2020/0020406 A1 Jan. 16, 2020

(30) Foreign Application Priority Data
Jul. 16, 2018 (KR) .................. 10-2018-0082530

(51) Int. Cl.
| | |
|---|---|
| *G11C 11/34* | (2006.01) |
| *G11C 16/20* | (2006.01) |
| *G11C 16/26* | (2006.01) |
| *G11C 16/08* | (2006.01) |
| *G11C 16/30* | (2006.01) |
| *G11C 16/34* | (2006.01) |
| *G11C 11/56* | (2006.01) |
| *G11C 16/04* | (2006.01) |

(52) U.S. Cl.
CPC ............. *G11C 16/20* (2013.01); *G11C 16/08* (2013.01); *G11C 16/26* (2013.01); *G11C 16/30* (2013.01); *G11C 16/3427* (2013.01); *G11C 11/5671* (2013.01); *G11C 16/0483* (2013.01)

(58) Field of Classification Search
CPC ......... G11C 16/20; G11C 16/08; G11C 16/26; G11C 16/30; G11C 16/3427; G11C 11/5671; G11C 16/0483
USPC .................................................... 365/185.11
See application file for complete search history.

(56) References Cited

U.S. PATENT DOCUMENTS

| | | | | |
|---|---|---|---|---|
| 9,128,890 | B2* | 9/2015 | Park | G06F 13/1663 |
| 9,299,439 | B2* | 3/2016 | Ghodsi | G11C 16/08 |
| 9,330,773 | B2* | 5/2016 | Lim | G11C 16/20 |
| 9,520,198 | B2* | 12/2016 | Choi | G11C 16/24 |
| 9,564,220 | B2* | 2/2017 | An | G11C 16/0483 |
| 9,633,737 | B2* | 4/2017 | An | G11C 16/14 |
| 9,899,093 | B2* | 2/2018 | Lee | G11C 16/10 |
| 10,176,872 | B2* | 1/2019 | Lee | G11C 16/0483 |

(Continued)

FOREIGN PATENT DOCUMENTS

| | | |
|---|---|---|
| KR | 1020120094709 | 8/2012 |
| KR | 1020150026248 | 3/2015 |

*Primary Examiner* — Viet Q Nguyen
(74) *Attorney, Agent, or Firm* — IP & T Group LLP (57) ABSTRACT

A memory device includes a memory cell array including a plurality of memory blocks; a peripheral circuit configured to sequentially perform a channel initialization operation and a read operation on a memory block selected from among the plurality of memory blocks; and control logic configured to control the peripheral circuit to perform the channel initialization operation and the read operation, wherein the control logic sets a time during which the channel initialization operation is to be performed as channel initialization period depending on a potential level of supply voltage, the channel initialization operation being performed to remove hot holes in a channel of the selected memory block.

19 Claims, 9 Drawing Sheets

(56) References Cited

U.S. PATENT DOCUMENTS

| | | | |
|---|---|---|---|
| 10,541,033 B2* | 1/2020 | Jung | G11C 16/08 |
| 2013/0343130 A1* | 12/2013 | Chen | G11C 16/06 |
| | | | 365/185.17 |
| 2016/0027520 A1* | 1/2016 | Choi | G11C 16/24 |
| | | | 365/185.17 |
| 2017/0337973 A1* | 11/2017 | Lee | G11C 16/10 |
| 2018/0374541 A1* | 12/2018 | Jung | G11C 16/08 |
| 2019/0318784 A1* | 10/2019 | Lee | G11C 11/5642 |
| 2020/0152275 A1* | 5/2020 | Cho | G11C 16/08 |

* cited by examiner

MEMORY DEVICE, MEMORY SYSTEM HAVING MEMORY DEVICE, AND METHOD OF OPERATING MEMORY DEVICE

CROSS-REFERENCE TO RELATED APPLICATION

The present application claims priority under 35 U.S.C. § 119(a) to Korean patent application number 10-2018-0082530, filed on Jul. 16, 2018, the entire disclosure of which is incorporated herein by reference in its entirety.

BACKGROUND

1. Field of Invention

Various embodiments of the present disclosure relate to a memory device, a memory system having the memory device, and a method of operating the memory device, and more particularly, to a memory device, a memory system having the memory device, and a method of operating the memory device, capable of preventing a read disturb phenomenon.

2. Description of Related Art

Recently, the paradigm for a computer environment has shifted to ubiquitous computing in which computer systems can be used anytime and anywhere. Due to this, the use of portable electronic devices such as mobile phones, digital cameras, and notebook computers has rapidly increased. In general, such portable electronic devices use a memory system which employs a memory device, in other words, a data storage device. The data storage device is used as a main memory device or an auxiliary memory device for portable electronic devices.

A data storage device using a memory device provides advantages in that, since there is no mechanical driving part, stability and durability are excellent, information access speed is very high, and power consumption is low. Data storage devices, as an example of the memory system having such advantages, include a universal serial bus (USB) memory device, memory cards having various interfaces, a solid state drive (SSD), etc.

SUMMARY

Various embodiments of the present disclosure are directed to a memory device, a memory system having the memory device, and a method of operating the memory device, which adjust a channel initialization period depending on the result of detection of the level of power during a read operation.

An embodiment of the present disclosure may provide for a memory device. The memory device may include a memory cell array including a plurality of memory blocks; a peripheral circuit configured to sequentially perform a channel initialization operation and a read operation on a memory block selected from among the plurality of memory blocks; and control logic configured to control the peripheral circuit to perform the channel initialization operation and the read operation, wherein the control logic sets a time during which the channel initialization operation is to be performed as channel initialization period depending on a potential level of supply voltage, the channel initialization operation being performed to remove hot holes in a channel of the selected memory block.

An embodiment of the present disclosure may provide for memory system. The memory system may include a memory device, including a plurality of memory blocks, configured to perform a program operation and a read operation on the plurality of memory blocks; and a memory controller configured to control the memory device to perform the read operation, wherein the memory device is controlled to vary a time during which a channel initialization operation is to be performed as channel initialization period before the read operation is performed, depending on a potential level of a supply voltage supplied to the memory device.

An embodiment of the present disclosure may provide for a method of operating a memory device. The method may include detecting a potential level of a supply voltage applied to the memory device, when a read command is received; setting a time of a channel initialization period, during which a channel initialization operation is performed, depending on the detected potential level of the supply voltage; and applying a turn-on voltage to select lines and word lines of a selected memory block during the channel initialization period.

An embodiment of the present disclosure may provide for a method of operating a memory device, which includes a plurality of memory blocks. The method may include detecting a supply voltage of the memory device; increasing a channel initialization period, during which a channel initialization operation is performed, when the supply voltage is detected to have decreased; and initializing a channel of a memory block, selected from among the plurality of memory blocks, based on the increased channel initialization period.

DETAILED DESCRIPTION

Specific structural and functional descriptions are provided for the disclosed embodiments of the present disclosure. However, neither the descriptions nor the invention itself should be construed as being limited to the disclosed embodiments.

The present disclosure may be embodied in many different forms and should not be construed as being limited to only the embodiments set forth herein, but should be construed as covering modifications, equivalents or alternatives falling within the scope of the present disclosure. That is, the present disclosure is not limited to any particular modes of practice. Rather, all changes, equivalents, and substitutes that do not depart from the spirit and technical scope of the present disclosure are encompassed in the present disclosure. Also, throughout the specification, reference to "an embodiment" or the like is not necessarily to only one embodiment, and different references to any such phrase are not necessarily to the same embodiment(s).

It will be understood that, although the terms "first" and/or "second" may be used herein to identify various elements, these elements should not be limited by these terms. These terms are only used to distinguish one element from another element that otherwise have the same or similar names. For instance, a first element in one instance may to be referred to as a second element in another instance, and vice versa, without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Communication between two elements, whether directly or indirectly connected/coupled, may be wired or wireless, unless stated or the context indicates otherwise. Other expressions that explain the relationship between elements, such as "between", "directly between", "adjacent to" or directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific to terms used herein have the same meaning as commonly understood by one of ordinary skill in the art to which the present disclosure belongs. It will be further understood that terms used herein should be interpreted as having a meaning that is consistent with their meaning in the context of this specification and the relevant art and not be interpreted in an idealized or overly formal sense unless expressly so defined herein.

Detailed description of functions and structures well known to those skilled in the art may be omitted to avoid obscuring the subject matter of the present disclosure. This aims to make the present invention more clear.

Embodiments of the present disclosure are described with reference to the accompanying drawings in order to describe the present disclosure in detail so that those skilled in the technical field to which the present disclosure pertains can easily practice the present disclosure.

Figure 1:
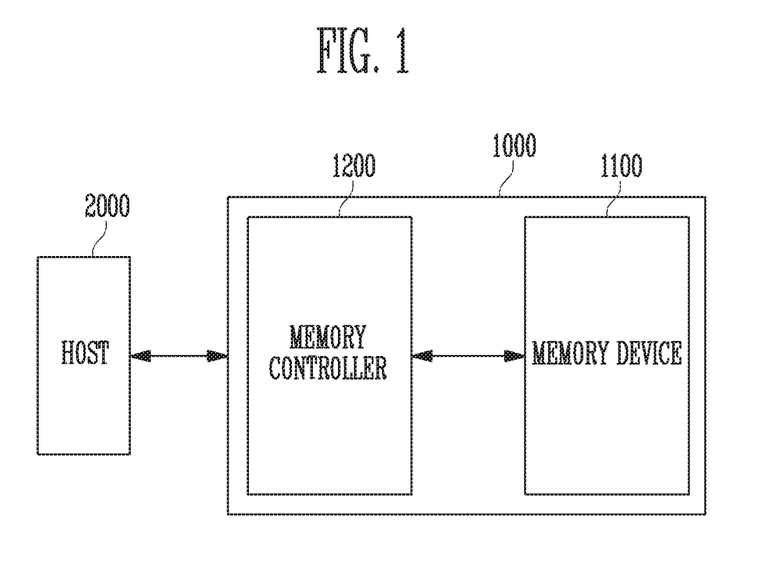
FIG. 1 is a diagram illustrating a memory system in accordance with an embodiment of the present disclosure.

FIG. 1 is a diagram illustrating a memory system 1000 in accordance with an embodiment of the present disclosure.

Referring to FIG. 1, the memory system 1000 may include a memory device 1100 which stores data, and a memory controller 1200 which controls the memory device 1100 under the control of a host 2000.

The host 2000 is capable of communicating with the memory system 1000 using an interface protocol, such as peripheral component interconnect express (PCI-e or PCIe), advanced technology attachment (ATA), serial ATA (SATA), parallel ATA (PATA) or serial attached SCSI (SAS). In addition, the interface protocol between the host 2000 and the to memory system 1000 is not limited to the above-described examples; instead, one of various interface protocols, such as universal serial bus (USB), multi-media card (MMC), enhanced small disk interface (ESDI), and integrated drive electronics (IDE) may be used.

The memory controller 1200 may control the overall operation of the memory system 1000, and may control data exchange between the host 2000 and the memory device 1100. For example, the memory controller 1200 may program or read data by controlling the memory device 1100 in response to a request received from the host 2000. In an embodiment, the memory device 1100 may include a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus DRAM (RDRAM) or a flash memory.

The memory device 1100 may perform a program operation, a read operation or an erase operation under the control of the memory controller 1200.

Figure 2:
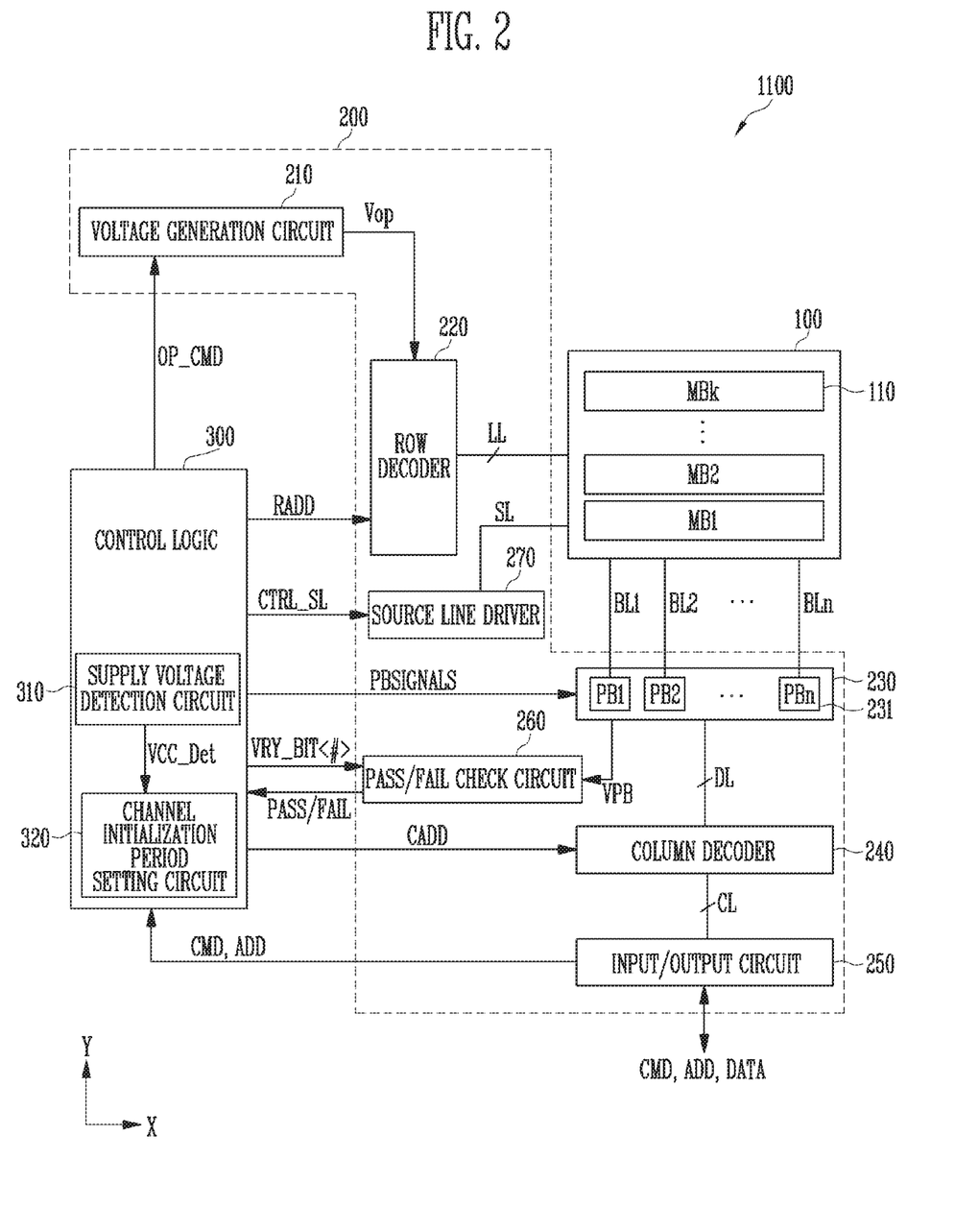
FIG. 2 is a diagram illustrating an exemplary memory device of FIG. 1.

FIG. 2 is a diagram illustrating the memory device of FIG. 1.

Referring to FIG. 2, the memory device 1100 may include a memory cell array 100 in which data is stored. The memory device 1100 may also include a peripheral circuit 200, which performs a program operation for storing data in the memory cell array 100, a read operation for outputting data stored in the memory cell array 100, and an erase operation for erasing stored data. The memory device 1100 may include control logic 300, which controls the peripheral circuit 200 under the control of an external controller (e.g., memory controller 1200 of FIG. 1).

The memory cell array 100 may include a plurality of memory blocks MB1 to MBk 110 (where k is a positive integer). Local lines LL and bit lines BL1 to BLn (where n is a positive integer) may be coupled to each of the memory blocks MB1 to MBk 110. For example, the local lines LL may include a first select line, a second select line, and a plurality of word lines arranged between the first and second select lines. Further, the local lines LL may include dummy lines arranged between the first select line and the word lines and between the second select line and the word lines. Here, the first select line may be a source select line, and the second select line may be a drain select line. For example, the local lines LL may include word lines, drain and source select lines, and source lines. For example, the local lines LL may further include dummy lines. For example, the local lines LL may further include pipelines. The local lines LL may be coupled to the memory blocks MB1 to MBk 110, respectively, and the bit lines BL1 to BLn may be coupled in common to the memory blocks MB1 to MBk 110. The memory blocks MB1 to MBk 110 may be implemented as a two-dimensional (2D) or a three-dimensional (3D) structure.

For example, the memory cells in the memory blocks having a 2D structure may be arranged horizontally on a substrate. For example, memory cells in the memory blocks having a 3D structure may be stacked vertically on the substrate.

The peripheral circuit 200 may perform program, read, and erase to operations on a selected memory block among the memory blocks 110 under the control of the control logic 300. For example, the peripheral circuit 200 may include a voltage generation circuit 210, a row decoder 220, a page buffer group 230, a column decoder 240, an input/output circuit 250, a pass/fail check circuit 260, and a source line driver 270.

The voltage generation circuit 210 may generate various operating voltages Vop that are used for program, read, and erase operations in response to an operation signal OP_CMD. Further, the voltage generation circuit 210 may selectively discharge the local lines LL in response to the operation signal OP_CMD. For example, the voltage generation circuit 210 may generate various voltages, such as a program voltage, a verify voltage, pass voltages, a turn-on voltage, a read voltage, and a source line voltage under the control of the control logic 300.

The row decoder 220 may transfer the operating voltages Vop to the local lines LL coupled to the selected memory block 110 in response to a row address RADD.

The page buffer group 230 may include a plurality of page buffers PB1 to PBn 231 coupled to the bit lines BL1 to BLn. The page buffers PB1 to PBn 231 may be operated in response to page buffer control signals PBSIGNALS. For example, the page buffers PB1 to PBn 231 may temporarily store data received through the bit lines BL1 to BLn or may sense voltages or currents of the bit lines BL1 to BLn during a read or verify operation.

The column decoder 240 may transfer data between the to input/output circuit 250 and the page buffer group 230 in response to a column address CADD. For example, the column decoder 240 may exchange data with the page buffers 231 through data lines DL or may exchange data with the input/output circuit 250 through column lines CL.

The input/output circuit 250 may transmit a command CMD and an address ADD, received from the external controller (e.g., memory controller 1200 of FIG. 1), to the control logic 300, or may exchange data with the column decoder 240.

The pass/fail check circuit 260 may generate a reference current in response to an enable bit VRY_BIT<#>. The pass/fail check circuit 260 may output a pass signal PASS or a fail signal FAIL by comparing a sensing voltage VPB, received from the page buffer group 230, with a reference voltage, generated based on the reference current, during the read operation or the verify operation.

The source line driver 270 may be coupled to memory cells included in the memory cell array 100 through a source line SL, and may control the voltage of a source node. In an example, the source line driver 270 may electrically couple the source node of each memory cell to a ground node during a read or verify operation. Further, the source line driver 270 may apply a ground voltage to the source node of each memory cell during a program operation. The source line driver 270 may apply an erase voltage to the source node of each memory cell during an erase operation. The source line driver 270 may receive a source line control signal CTRL_SL from the control logic 300, and may control the voltage of the source node in response to the source line control signal CTRL_SL.

The control logic 300 may control the peripheral circuit 200 by outputting the operation signal OP_CMD, the row address RADD, the source line control signal CTRL_SL, the page buffer control signals PBSIGNALS, the enable bit VRY_BIT<#>, and the column address CADD in response to the command CMD and the address ADD. In addition, the control logic 300 may determine whether a verify operation has passed or failed in response to the pass or fail signal PASS or FAIL.

The control logic 300 may include a supply voltage detection circuit 310 and a channel initialization period setting circuit 320. The supply voltage detection circuit 310 may detect the potential level of the supply voltage of the memory device 1100 and output the detected potential level as a detection signal VCC_Det. The channel initialization period setting circuit 320 may set the length of a channel initialization period in response to the detection signal VCC_Det. The channel initialization period may be a period of time during which an operation of initializing the channel of memory strings of a selected memory block is to be performed in a read operation. In other words, the supply voltage detection circuit 310 may detect the potential level of a supply voltage and then output the detection signal VCC_Det, and the channel initialization period setting circuit 320 may set the length of the channel initialization period by adjusting the active (or turn-on) interval of the channel initialization period in response to the detection signal VCC_Det. In various embodiments, the channel initialization period is set so that, as the potential level of the supply voltage is decreased, the active interval of the channel initialization period is increased. For example, when the potential level of the supply voltage is less than a reference voltage, the active interval of the channel initialization period may be set to a first time period, whereas when the potential level of the supply voltage is greater than or equal to the reference voltage, the active interval of the channel initialization period may be set to a second time period shorter than the first time period. Detailed description of the channel initialization period in the read operation is given below.

Figure 3:
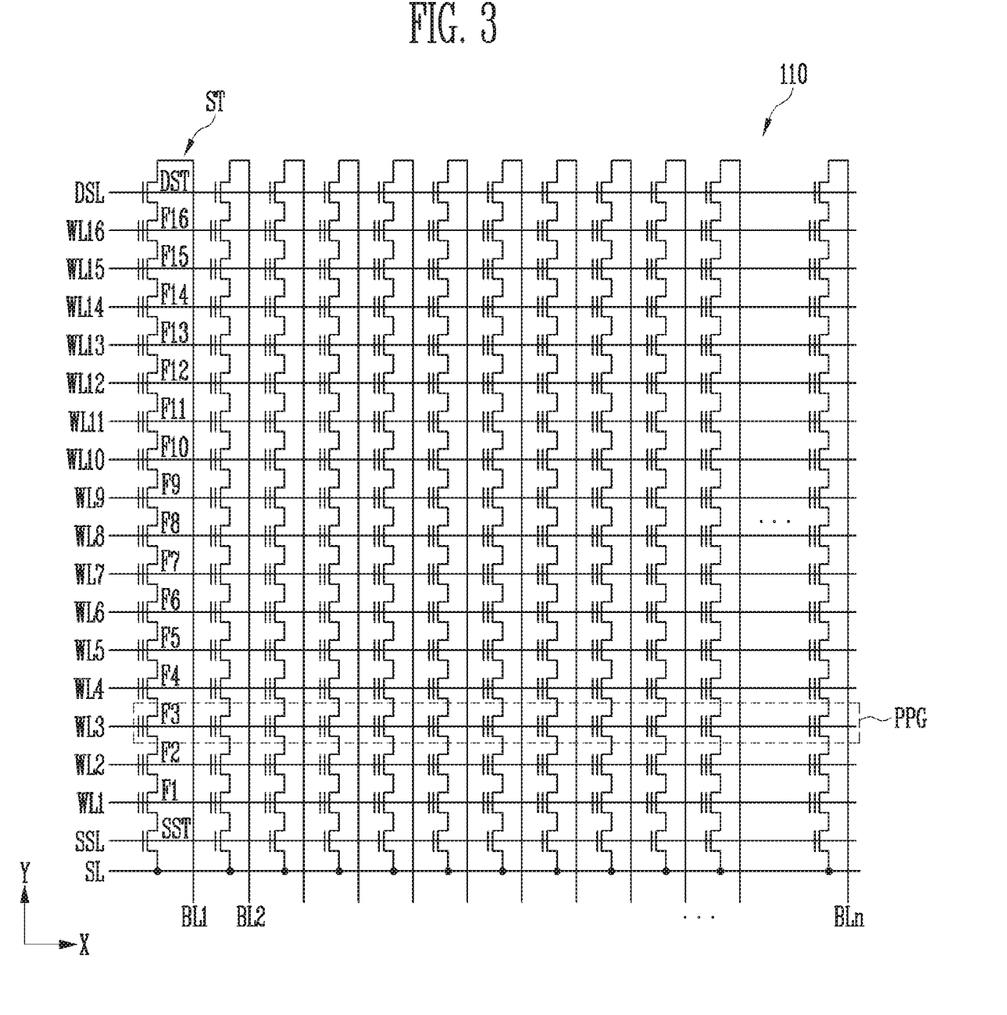
FIG. 3 is a diagram illustrating an example of a memory block of FIG. 2.

FIG. 3 is a diagram illustrating the memory block 110 of FIG. 2.

Referring to FIG. 3, the memory block 110 may be configured such that a plurality of word lines, which are arranged in parallel, are coupled between a first select line and a second select line. Here, the first select line may be a source select line SSL and the second select line may be a drain select line DSL. In detail, the memory block 110 may include a plurality of strings ST coupled between bit lines BL1 to BLn and a source line SL. The bit lines BL1 to BLn may be respectively coupled to the strings ST, and the source line may be coupled in common to the strings ST. Since the strings ST may have the same configuration, a string ST coupled to the first bit line BL1 will be described in detail by way of example.

The string ST may include a source select transistor SST, a plurality of memory cells F1 to F16, and a drain select transistor DST, which are to connected in series between the source line SL and the first bit line BL1. One string ST may include one or more source select transistors SST and drain select transistors DST, and may include more than the sixteen memory cells F1 to F16 illustrated in the drawing.

A source of the source select transistor SST may be coupled to the source line SL and a drain of the drain select transistor DST may be coupled to the first bit line BL1. The memory cells F1 to F16 may be connected in series between the source select transistor SST and the drain select transistor DST. Gates of the source select transistors SST included in different strings ST may be coupled to a source select line SSL, gates of the drain select transistors DST may be coupled to a drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page PPG." Therefore, a number of physical pages PPG that are identical to the number of word lines WL1 to WL16 may be included in the memory block 110.

One memory cell may store one bit of data. This is typically referred to as a "single-level cell (SLC)." In this case, one physical page PPG may store data corresponding to one logical page LPG. The data corresponding to one logical page LPG may include a number of data bits identical to the number of cells included in one physical page PPG. Further, one memory cell may store two or more bits of data. This cell is to typically referred to as a "multi-level cell (MLC)". Here, one physical page PPG may store data corresponding to two or more logical pages LPG.

Figure 4:
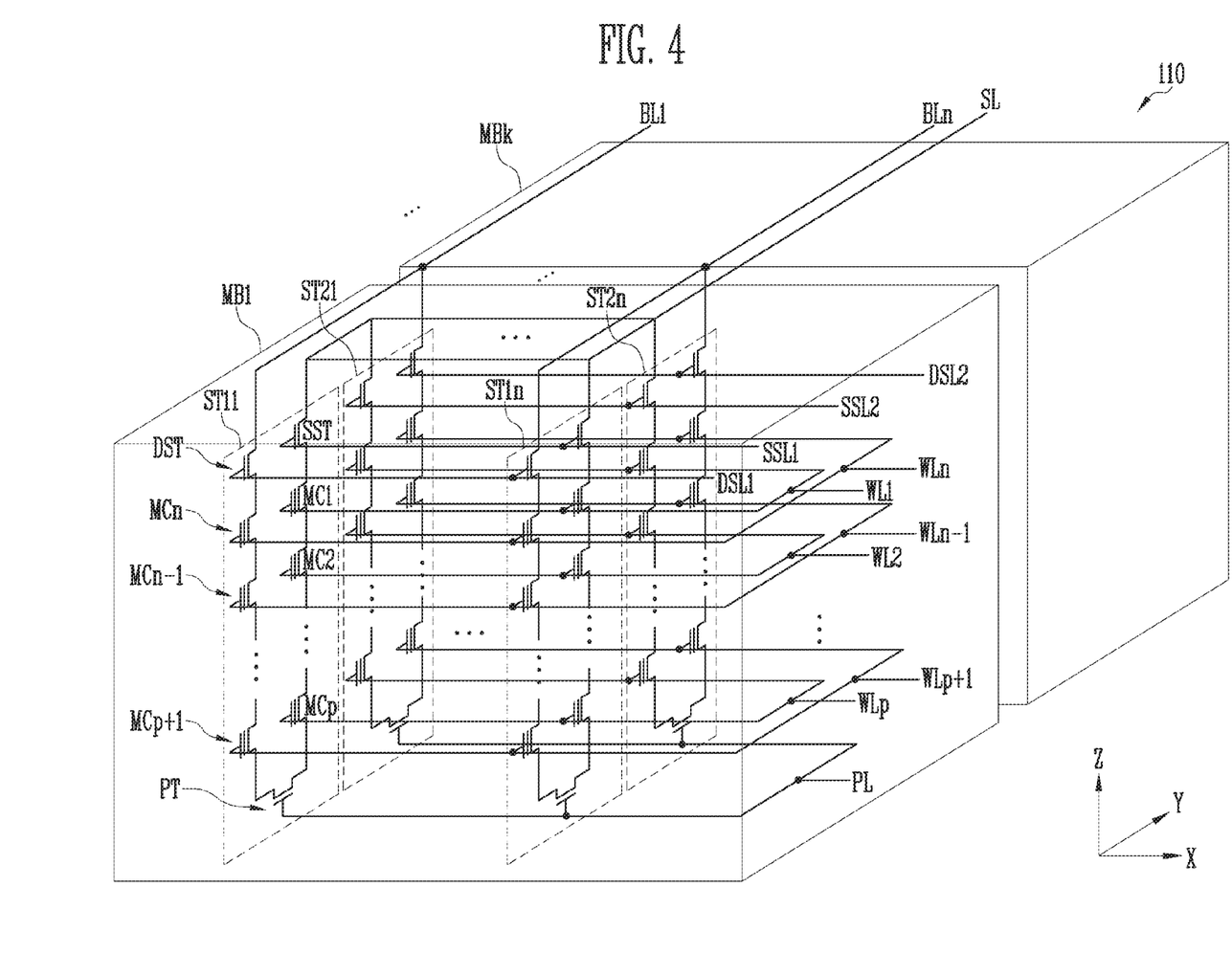
FIG. 4 is a diagram illustrating an example of a memory block having a three-dimensional (3D) structure.

FIG. 4 is a diagram illustrating an example of a memory block of a memory cell array 100 of FIG. 2, having a three-dimensional (3D) structure.

Referring to FIG. 4, the memory cell array 100 may include a plurality of memory blocks MB1 to MBk 110. Each of the memory blocks 110 may include a plurality of strings ST11 to ST1$n$ and ST21 to ST2$n$. In an embodiment, each of the strings ST11 to ST1$n$ and ST21 to ST2$n$ may be formed in a 'U' shape. In the first memory block MB1, n strings may be arranged in a row direction (e.g., X direction). Although, in FIG. 4, two strings are illustrated as being arranged in a column direction (e.g., Y direction), such illustration is for clarity; three or more strings may be arranged in the column direction (e.g., Y direction) in other embodiments.

Each of the plurality of strings ST11 to ST1$n$ and ST21 to ST2$n$ may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. For example, a pillar for providing at least one of the channel layers, the tunnel insulating layer, the charge trap layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, the source select transistors of the strings ST11 to ST1$n$ in a first row may be coupled to a first source select line SSL1. The source select transistors of the strings ST21 to ST2$n$ in a second row may be coupled to a second source select line SSL2.

In other embodiments, the source select transistors of the strings ST11 to ST1$n$ and ST21 to ST2$n$ may be coupled in common to one source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a vertical direction (e.g., Z direction), and may be coupled in series between the source select transistor SST and the pipe to transistor PT. The p+1-th to n-th memory cells MCp+1 to MCn may be sequentially arranged in the vertical direction (e.g., Z direction), and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1$n$ in the first row may be coupled to a drain select line DSL1. The drain select transistors of the strings ST21 to ST2$n$ in the second row may be coupled to a second drain select line DSL2.

The strings arranged in the column direction may be coupled to bit lines extending in the column direction. In FIG. 4, the strings ST11 and ST21 in a first column may be coupled to a first bit line BL1. The strings to ST1$n$ and ST2$n$ in an n-th column may be coupled to an n-th bit line BLn.

Among strings arranged in the row direction, memory cells coupled to the same word line may constitute one page. For example, memory cells coupled to the first word line WL1, among the strings ST11 to ST1$n$ in the first row, may constitute one page. Among the strings ST21 to ST2$n$ in the second row, memory cells coupled to the first word line WL1 may constitute one additional page. Strings arranged in the direction of a single row may be selected by selecting any one of the drain select lines DSL1 and DSL2. One page may be selected from the selected strings by selecting any one of the word lines WL1 to WLn.

Figure 5:
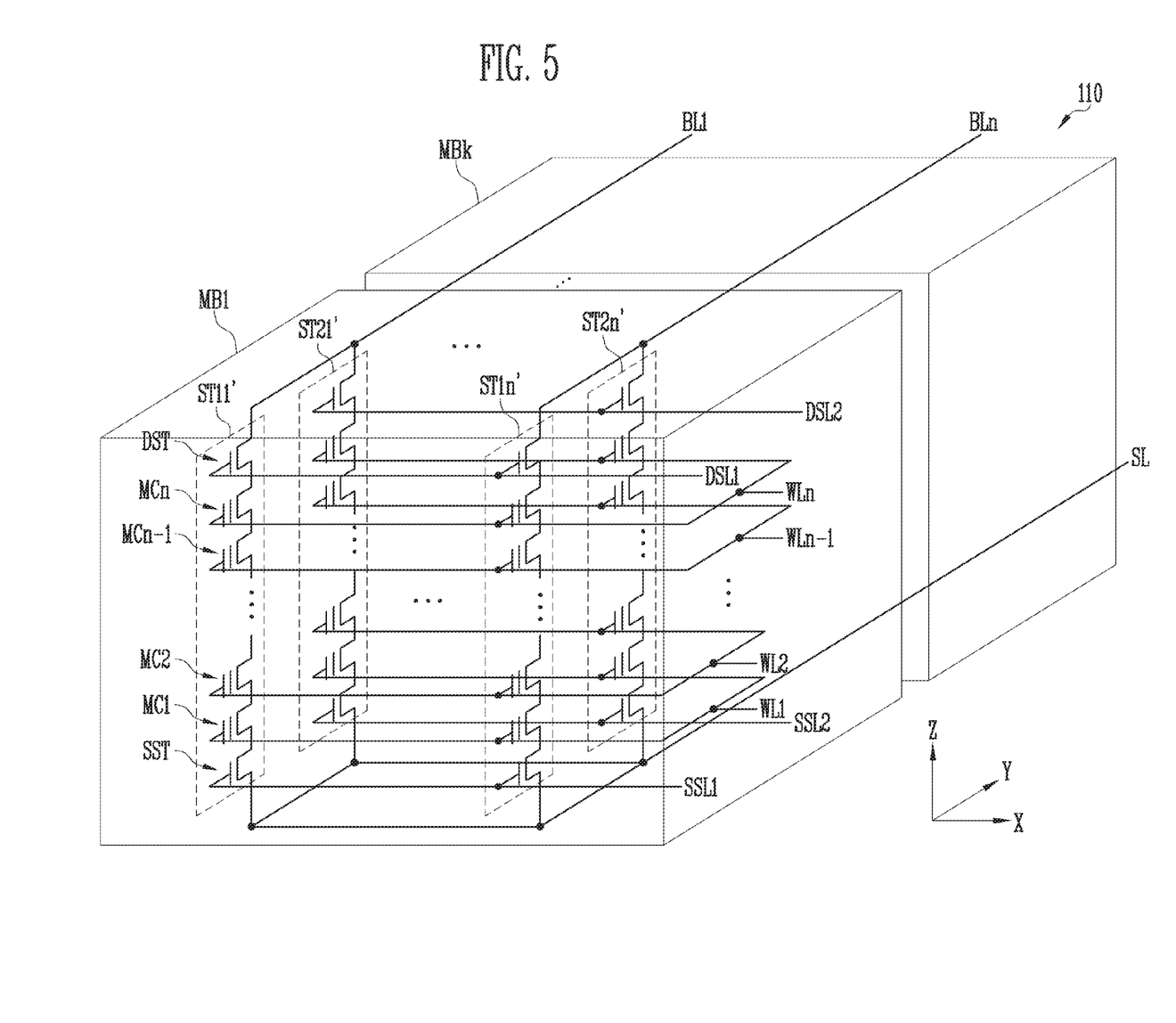
FIG. 5 is a diagram illustrating an example of a memory block having a 3D structure.

FIG. 5 is a diagram illustrating an example of a memory block of a memory cell array 100 of FIG. 2, having a three-dimensional (3D) structure.

Referring to FIG. 5, the memory cell array 100 may include a plurality of memory blocks MB1 to MBk 110. Each of the memory blocks 110 may include a plurality of strings ST11' to ST1$n$' and ST21' to ST2$n$'. Each of the strings ST11' to ST1$n$' and ST21' to ST2$n$' may extend in a vertical direction (e.g., Z direction). In the memory block 110, n strings may be arranged in a row direction (e.g., X direction). Although, in FIG. 5, two strings are illustrated as being arranged in a column direction (e.g., Y direction), such illustration is for clarity; three or more strings may be arranged in the column direction (e.g., Y direction) in other embodiments.

Each of the strings ST11' to ST1$n$' and ST21' to ST2$n$' may include at least one source select transistor SST, first to n-th memory cells MC1 to to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11' to ST1n' arranged in a first row may be coupled to a first source select line SSL1. The source select transistors of the strings ST21' to ST2n' arranged in a second row may be coupled to a second source select line SSL2. In an embodiment, the source select transistors of the strings ST11' to ST1n' and ST21' to ST2n' may be coupled in common to a single source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Thereby, the reliability of data stored in the memory block 110 may be improved.

The drain select transistor DST of each string may be coupled between the corresponding bit line and the memory cells MC1 to MCn. The drain select transistors DST of strings arranged in the row direction may be coupled to a drain select line extending in the row direction. The to drain select transistors DST of the strings ST11' to ST1n' in the first row may be coupled to a first drain select line DSL1. The drain select transistors DST of the strings ST21' to ST2n' in the second row may be coupled to a second drain select line DSL2.

That is, the memory block 110 of FIG. 5 may have an equivalent circuit similar to that of the memory block 110 of FIG. 4 except that a pipe transistor PT is excluded from each string.

The plurality of memory blocks MB1 to MBk 110 described in FIGS. 4 and 5 may share the source line SL.

Figure 6:
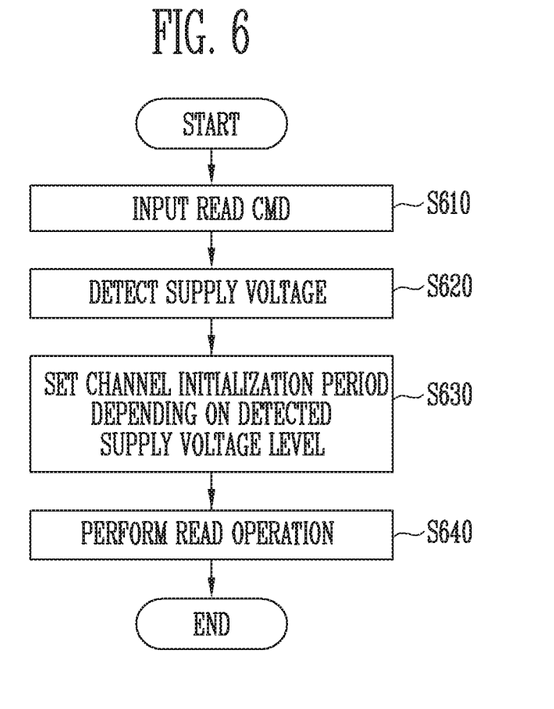
FIG. 6 is a flowchart illustrating a read operation of a memory system in accordance with an embodiment of the present disclosure.

FIG. 6 is a flowchart illustrating a read operation of a memory system in accordance with an embodiment of the present disclosure.

Figure 7A:
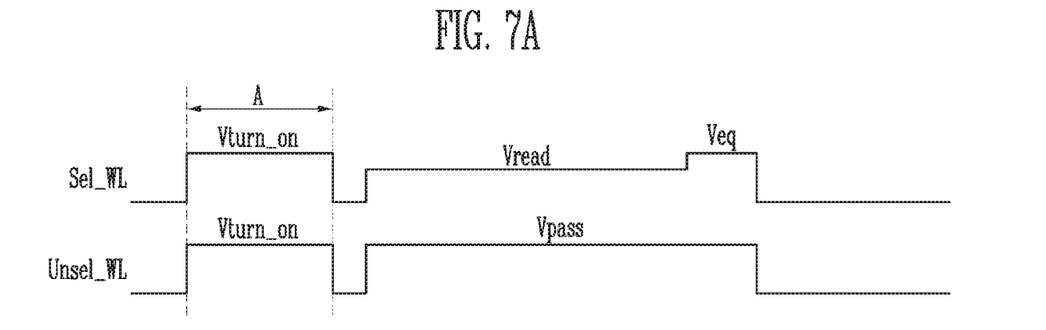
FIGS. 7A and 7B are voltage waveform diagrams illustrating a read operation of a memory system in accordance with an embodiment of the present disclosure.
Figure 7B:
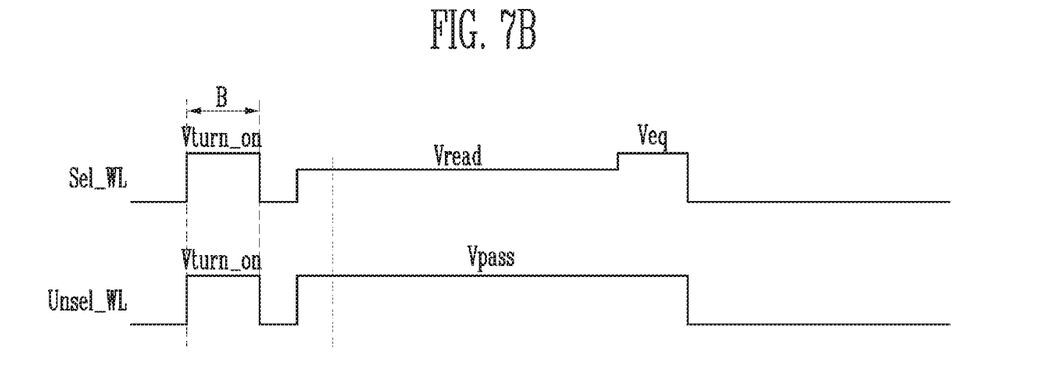

FIGS. 7A and 7B are voltage waveform diagrams illustrating a read operation of a memory system in accordance with an embodiment of the present disclosure.

The read operation of the memory system in accordance with an embodiment of the present disclosure will be described below with reference to FIGS. 1 to 7B.

Inputting a read command (S610).

When a read command Read CMD is received from the host 2000, the memory controller 1200 generates a command CMD for controlling the read operation of the memory device 1100 in response to the read command Read CMD. Further, the memory controller 1200 translates an address (i.e., a logical address) received together with the read command Read CMD into an address of the memory device 1100 (i.e., a physical to address), and then generates the translated address ADD.

Detecting a supply voltage (S620).

When the command CMD is received from the memory controller 1200, the control logic 300 of the memory device 1100 detects the potential level of the supply voltage. That is, the supply voltage detection circuit 310 of the control logic 300 detects the potential level of the supply voltage, and then generates and outputs a detection signal VCC_Det.

Setting a channel initialization period depending on the detected potential level of the supply voltage (S630).

The channel initialization period setting circuit 320 sets the channel initialization period depending on the detection signal VCC_Det. In other words, the channel initialization period setting circuit 320 sets the active (or turn-on) interval of the channel initialization period in response to the detection signal VCC_Det. In various embodiments, the channel initialization period may be set such that, as the potential level of the supply voltage is decreased, the active interval of the channel initialization period is increased. When the potential level of the supply voltage is less than a reference voltage, the active interval of the channel initialization period may be set to a first time period (e.g., A of FIG. 7A). When the potential level of the supply voltage is greater than or equal to the reference voltage, the active interval of the channel initialization period may be set to a second time period (e.g., B of FIG. 7B) shorter than the first time period.

Performing a read operation (S640).

When the channel initialization period is set at the above-described step S630, a read operation is performed on the selected memory block.

The read operation will be described in detail below.

A plurality of memory blocks may be designed to share word lines and a source line. Consequently, when a program operation, a read operation or an erase operation is performed on a memory block selected from among the plurality of memory blocks, an operating voltage is applied to word lines and a source select line of an unselected memory block, and thus hot holes may be generated and remain in the channel of a memory string in the unselected memory block. During the read operation, the hot holes remaining in the channel may cause a read disturb phenomenon. Accordingly, during the channel initialization period of the read operation, a channel initialization operation may be performed. Through the channel initialization operation, the hot holes remaining in the channel may be removed.

The voltage generation circuit 210 may generate and output a turn-on voltage Vturn_on during the channel initialization period, which is set by the channel initialization period setting circuit 320, in response to the operation signal OP_CMD. The row decoder 220 may apply the turn-on voltage Vturn_on to the source select line SSL, the drain select line DSL, and all word lines WL1 to WL16 of the selected memory block (e.g., MB1). In response to the turn-on voltage Vturn_on, the source select transistor SST, the plurality of memory cells F1 to F16, and the drain select to transistor DST of the selected memory block MB1 are turned on, and the channel of the selected memory block MB1 is electrically coupled to the source line SL at a ground voltage level. Thus, the hot holes in the channel of the selected memory block MB1 are removed.

Generally, the supply voltage of the memory device 1100 is uniformly maintained and supplied at a set level or higher. However, when the multi-operation of the memory system 1000 is performed, current consumption may be increased, and thus the supply voltage may be decreased. When the supply voltage becomes less than the set level, the hot holes in the channel may not be desirably removed in the channel initialization period during the read operation of the memory device 1100. When the supply voltage is less than the set level, which situation is depicted in FIG. 7A, the channel initialization period may be set to a first time period (e.g., A of FIG. 7A), and the operation of initializing the channel of the memory strings of the selected memory block is performed, and thus a read disturb phenomenon may be prevented. In contrast, when the channel initialization period is extended, the entire read operation speed may be decreased. When the supply voltage is greater than the set level, which situation is depicted in FIG. 7B, the channel initialization period may be set to a second time period (e.g., B of FIG. 7B) shorter than the first time period, and the operation of initializing the channel of the memory strings of the selected memory block is performed. Thus, the read operation speed may be improved.

After the channel initialization period, the voltage generation circuit 210 generates a read voltage Vread and a pass voltage Vpass in response to the operation signal OP_CMD. The row decoder 220 applies the read voltage Vread to a selected word line Sel_WL, among the plurality of word lines, and applies the pass voltage Vpass to an unselected word line Unsel_WL, among the plurality of word lines.

When the read voltage Vread is applied, the plurality of page buffers PB1 to PBn 231 of the page buffer group 230 may sense data programmed to memory cells included in the selected page by sensing the potential levels or currents of the bit lines BL1 to BLn corresponding thereto, and may temporarily store the programmed data. The temporarily stored data may be output to the memory controller 1200 through the column decoder 240 and the input/output circuit 250.

After the read voltage Vread has been applied for a set or predetermined period of time, the voltage generation circuit 210 generates an equalization voltage Veq in response to the operation signal OP_CMD. The row decoder 220 may apply the equalization voltage Veq to the selected word line Sel_WL, and thereafter discharge the selected word line Sel_WL and the unselected word line Unsel_WL to a low level after a certain period of time has elapsed. The equalizing voltage Veq may have the same potential level as the pass voltage Vpass. Thus, the selected word line Sel_WL and the unselected word line Unsel_WL may be discharged from the same potential level, and may then be discharged for the same discharge time and to the same level.

In accordance with embodiments of the present disclosure, when a to read operation is performed on a selected memory block of the memory device 1100, the potential level of the supply voltage of the memory device 1100 is detected. When the potential level of the supply voltage is detected to be less than a set level, the channel initialization period is set to a relatively long time. Accordingly, a read disturb phenomenon may be prevented by effectively removing hot holes in the channel of the selected memory block in the channel initialization period. When the potential level of the supply voltage is greater than or equal to the set level, the channel initialization period is normally set, and thus an increase in the read operation speed may be resolved.

Figure 8:
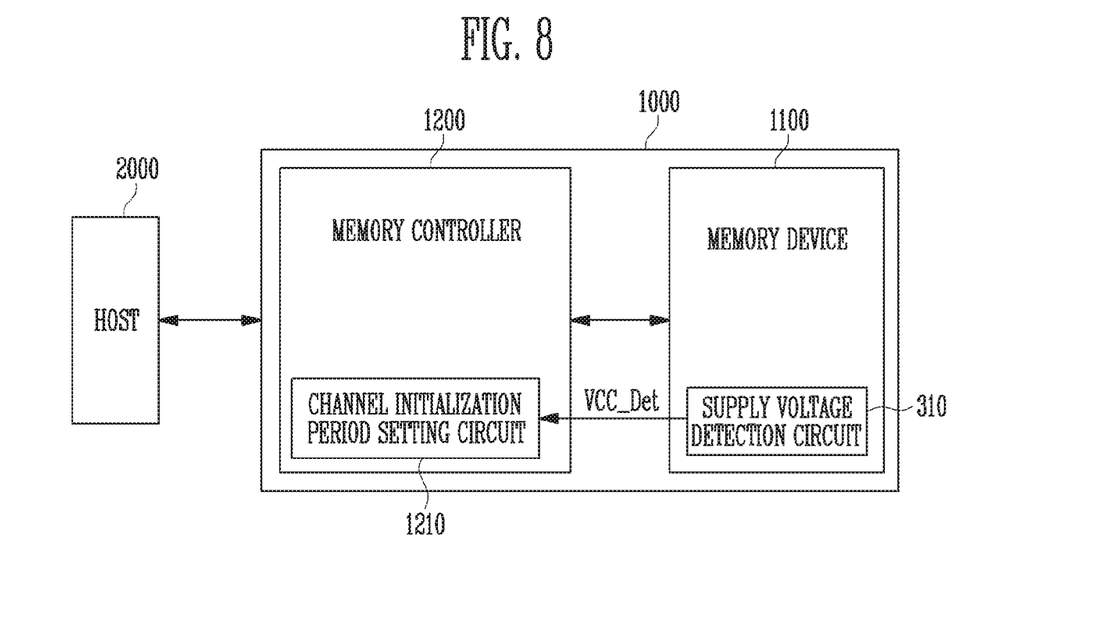
FIG. 8 is a diagram illustrating a memory system in accordance with an embodiment of the present disclosure.

FIG. 8 is a diagram illustrating a memory system 1000 in accordance with an embodiment of the present disclosure.

Referring to FIG. 8, the memory system 1000 may include a memory device 1100 and a memory controller 1200. The memory controller 1200 may include a channel initialization period setting circuit 1210, which may be configured within the control logic 300 in FIG. 2. The memory device 1100 may include a supply voltage detection circuit 310.

When a command for a read operation is received from a host 2000, the supply voltage detection circuit 310 detects the potential level of a supply voltage that is applied to the memory device 1100. Then, the supply voltage detection circuit 310 generates a detection signal VCC_Det based on the detected potential level, and outputs the detection signal VCC_Det to the channel initialization period setting circuit 1210. The channel initialization period setting circuit 1210 sets a channel initialization period in response to the detection signal VCC_Det. During the channel initialization period for the read operation of the memory device 1100, the operation of initializing the channel of memory strings of a selected memory block may be performed.

The memory controller 1200 sets the time length of the channel initialization period, and outputs a command for controlling the read operation of the memory device 1100 to the memory device 1100.

The memory device 1100 may perform a read operation in response to the command received from the memory controller 1200. The memory device 1100 may perform an initial turn-on operation during the channel initialization period, of which the time length is set by the memory controller 1200.

In the above-described embodiment of the present disclosure, the channel initialization period is set depending on the potential level of the supply voltage applied to the memory device 1100. Alternatively, the channel initialization period may be set by adjusting the operating parameters of the memory device depending on the potential level of the supply voltage. For example, the operating parameters include the application time of a read voltage, the application time of a pass voltage, and the discharge time of a word line voltage.

Figure 9:
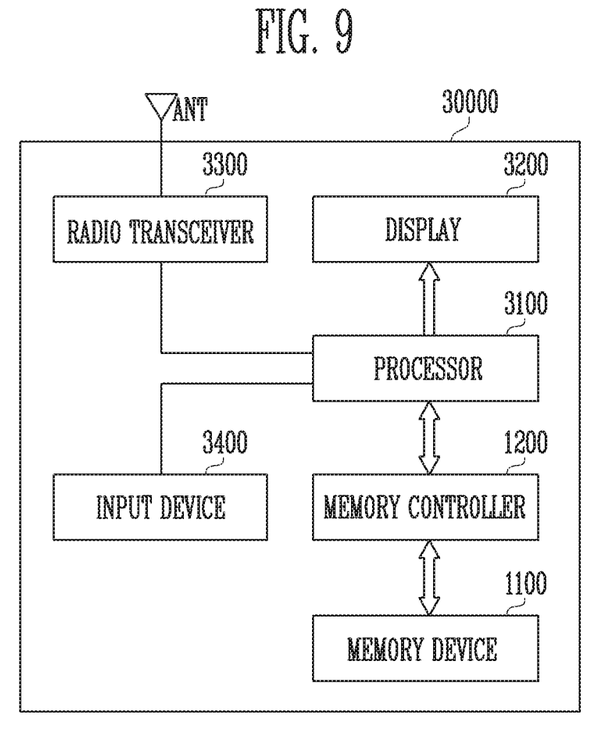
FIG. 9 is a diagram illustrating a memory system including a memory device in accordance with an embodiment of the present disclosure.

FIG. 9 is a diagram illustrating a memory system 30000 including a memory device, e.g., the memory device 1100 of FIG. 2, in accordance with an embodiment of the present disclosure.

Referring to FIG. 9, the memory system 30000 may be embodied in a cellular phone, a smartphone, a tablet personal computer (PC), a personal digital assistant (PDA) or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be outputted through a display 3200 under the control of the memory controller 1200.

A radio transceiver 3300 may send and receive radio signals through an antenna ANT. For example, the radio transceiver 3300 may convert a radio signal received through the antenna ANT into a signal which may be processed by the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal outputted from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data outputted from the memory controller 1200, data from the radio transceiver 3300 or data from the input device 3400 is outputted through the display 3200.

In an embodiment, the memory controller 1200 capable of controlling the operation of the memory device 1100 may be implemented as a part of the processor 3100 or a chip provided separately from the processor 3100.

Figure 10:
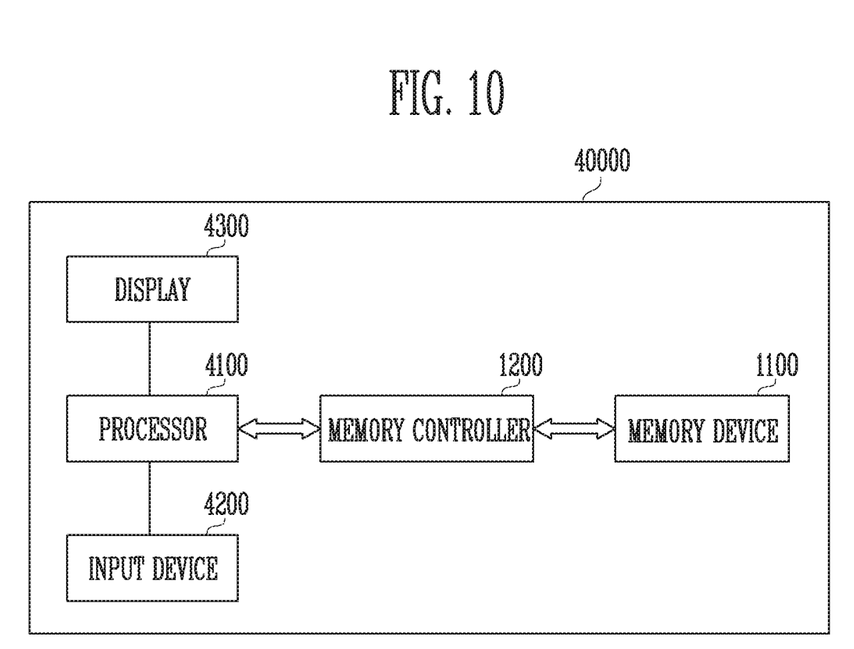
FIG. 10 is a diagram illustrating a memory system including a memory device in accordance with an embodiment of the present disclosure.

FIG. 10 is a diagram illustrating a memory system 40000 including a memory device, e.g., the memory device 1100 of FIG. 2, in accordance with an embodiment of the present disclosure.

Referring to FIG. 10, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data inputted from an input device 4200. For example, the input device 4200 may be implemented as a point device such as a touch pad or a computer mouse, to a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100.

Figure 11:
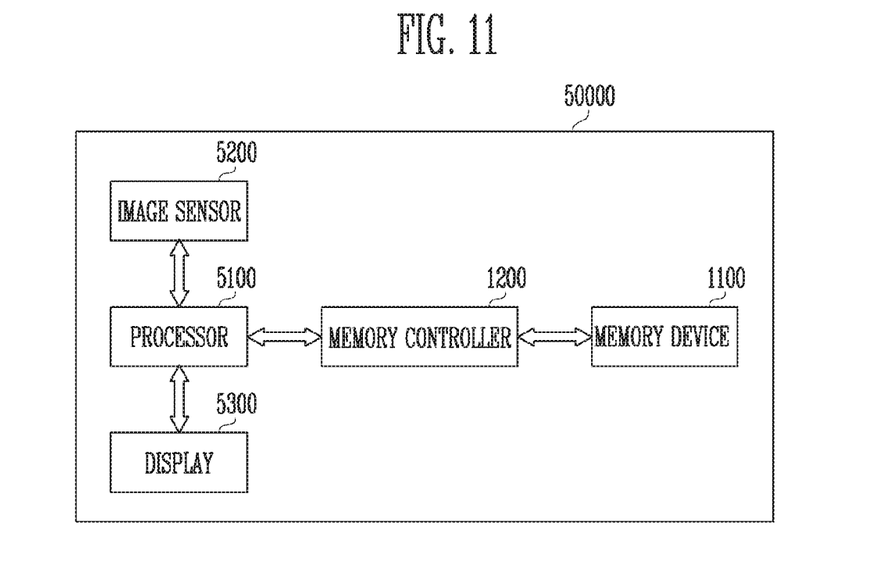
FIG. 11 is a diagram illustrating a memory system including a memory device in accordance with an embodiment of the present disclosure.

FIG. 11 is a diagram illustrating a memory system 50000 including a memory device, e.g., the memory device 1100 of FIG. 2, in accordance with an embodiment of the present disclosure.

Referring to FIG. 11, the memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be outputted through a display 5300 or stored in the memory device 1100 through the memory controller 1200. Data stored in the to memory device 1100 may be outputted through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100.

Figure 12:
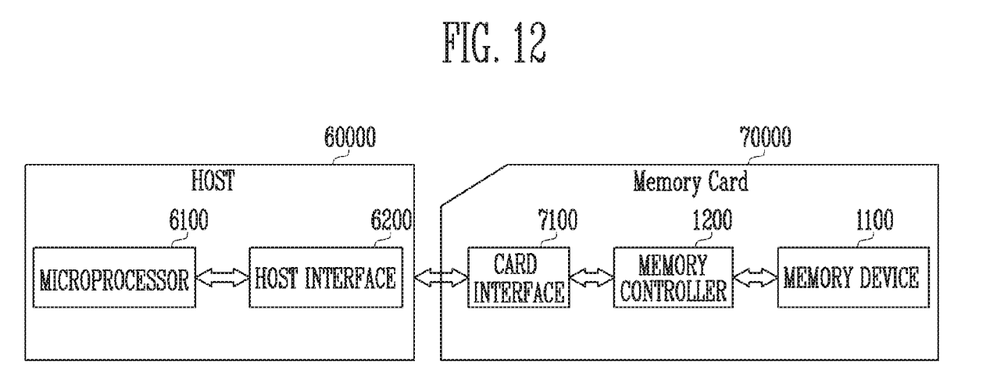
FIG. 12 is a diagram illustrating a memory system including a to memory device in accordance with an embodiment of the present disclosure.

FIG. 12 is a diagram illustrating a memory system 70000 including a memory device, e.g., the memory device 1100 of FIG. 2, in accordance with an embodiment of the present disclosure.

Referring to FIG. 12, the memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed to in the hardware, or a signal transmission method.

When the memory system 70000 is coupled to a host interface 6200 of the host 60000 such as a personal computer (PC), a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100.

In the above-discussed embodiments, all steps may be selectively performed or skipped. In addition, the steps in each embodiment may not always be performed in regular order. Furthermore, the embodiments disclosed herein aim to help those skilled in the relevant art to more clearly understand the present disclosure rather than to limit the bounds of the present disclosure. In other words, one skilled in the art to which the present disclosure belongs will be able to easily understand that various modifications are possible based on the technical scope of the present disclosure.

In accordance with the present disclosure, during a read operation, a channel initialization period is adjusted depending on the result of detection of the level of external power when the read operation is performed, thus preventing a read disturb phenomenon and improving the read operation speed.

Embodiments of the present disclosure have been described with reference to the accompanying drawings, and specific terms or words used in the description should be construed in accordance with the spirit of the present disclosure without limiting the subject matter thereof. One skilled in the art will appreciate in view of the present disclosure that various modifications, additions and substitutions are possible without departing from the scope and spirit of the present disclosure. Thus, the present invention is intended to embrace all such modifications, additions and substitutions that fall within the claims and their equivalents.

What is claimed is:

1. A memory device, comprising:
    a memory cell array including a plurality of memory blocks;
    a peripheral circuit configured to sequentially perform a channel initialization operation and a read operation on a memory block selected from among the plurality of memory blocks; and
    control logic configured to control the peripheral circuit to perform the channel initialization operation and the read operation,
    wherein the control logic sets a time during which the channel initialization operation is to be performed as channel initialization period depending on a potential level of supply voltage, the channel initialization operation being performed to remove hot holes in a channel of the selected memory block.

2. The memory device according to claim 1, wherein the control logic comprises:
    a supply voltage detection circuit configured to generate and output a detection signal depending on the potential level of the supply voltage; and
    a channel initialization period setting circuit configured to set the channel initialization period in response to the detection signal.

3. The memory device according to claim 1, wherein the control logic increases the channel initialization period as the supply voltage is decreased.

4. The memory device according to claim 1, wherein the control logic sets the channel initialization period to a first time period when the supply voltage is less than a reference voltage, and sets the channel initialization period a second time period, shorter than the first time period, when the supply voltage is greater than or equal to than the reference voltage.

5. The memory device according to claim 1, wherein the channel initialization operation includes applying a turn-on voltage to word lines and select lines of the selected memory block and then electrically coupling the channel of the selected memory block to a source line.

6. The memory device according to claim 5, wherein a read voltage and a pass voltage are applied to the word lines of the selected memory block after the channel initialization operation.

7. The memory device according to claim 6, wherein the peripheral circuit comprises:
 a voltage generation circuit configured to generate the turn-on voltage, the read voltage, and the pass voltage; and
 a row decoder configured to selectively apply the turn-on voltage, the read voltage, and the pass voltage to the select lines and the word lines of the selected memory block.

8. A memory system, comprising:
 a memory device, including a plurality of memory blocks, configured to perform a program operation and a read operation on the plurality of memory blocks; and
 a memory controller configured to control the memory device to perform the read operation, wherein the memory device is controlled to vary a time during which a channel initialization operation is to be performed as channel initialization period before the read operation is performed, depending on a potential level of a supply voltage supplied to the memory device.

9. The memory system according to claim 8, wherein the memory controller comprises:
 a supply voltage detection circuit configured to generate and output a detection signal depending on the potential level of the supply voltage; and
 a channel initialization period setting circuit configured to variably set the channel initialization period in response to the detection signal.

10. The memory system according to claim 9, wherein the channel initialization period setting circuit sets the channel initialization period so that the channel initialization period is increased as the supply voltage is decreased.

11. The memory system according to claim 9, wherein the channel initialization period setting circuit sets the channel initialization period to a first time period when the supply voltage is less than a reference voltage, and sets the channel initialization period to a second time period shorter than the first time period when the supply voltage is greater than or equal to than the reference voltage.

12. The memory system according to claim 8, wherein the channel initialization operation includes applying a turn-on voltage to word lines and select lines of a memory block selected from among the plurality of memory blocks and then electrically coupling a channel of the selected memory block to a source line.

13. The memory system according to claim 12, wherein a read voltage and a pass voltage are applied to the word lines of the selected memory block after the channel initialization operation.

14. A method of operating a memory device, comprising:
 detecting a potential level of a supply voltage applied to the memory device, when a read command is received;
 setting a time of a channel initialization period, during which a channel initialization operation is performed, depending on the detected potential level of the supply voltage; and
 applying a turn-on voltage to select lines and word lines of a selected memory block during the channel initialization period.

15. The method according to claim 14, further comprising applying a read voltage and a pass voltage to the word lines of the selected memory block after the channel initialization period.

16. The method according to claim 14, wherein setting the time of the channel initialization period comprises setting the channel initialization period so that the channel initialization period is increased as the detected potential level of the supply voltage is decreased.

17. The method according to claim 14, wherein setting the time of the channel initialization period comprises setting the channel initialization period to a first time period when the detected potential level of the supply voltage is less than a reference voltage, and setting the channel initialization period to a second time period shorter than the first time period when the detected potential level of the supply voltage is greater than or equal to the reference voltage.

18. A method for operating a memory system including a memory device, which includes a plurality of memory blocks, the method comprising:
 detecting a supply voltage of the memory device;
 increasing a channel initialization period, during which a channel initialization operation is performed, when the supply voltage is detected to have decreased; and
 initializing a channel of a memory block, selected from among the plurality of memory blocks, during the increased channel initialization period.

19. The method of claim 18, wherein initializing of the channel of the memory block comprises applying a turn-on voltage to word lines and select lines of the selected memory block during the increased channel initialization period.

* * * * *